United States Patent [19]

Andoh et al.

[11] Patent Number: 5,111,257
[45] Date of Patent: May 5, 1992

[54] ELECTRONIC INTEGRATED CIRCUIT HAVING AN ELECTRODE LAYER FOR ELEMENT ISOLATION

[75] Inventors: Nobuaki Andoh; Osamu Ueda, both of Hyogo, Japan

[73] Assignee: Mitsubishi Denki Kabushiki Kaisha, Tokyo, Japan

[21] Appl. No.: 450,768

[22] Filed: Dec. 14, 1989

[30] Foreign Application Priority Data

Dec. 21, 1988 [JP] Japan .................. 63-324244

[51] Int. Cl.$^5$ ............................. H01L 29/10
[52] U.S. Cl. .................. 357/23.4; 357/23.6; 357/23.8; 357/23.5
[58] Field of Search .............. 357/23.4, 23.5, 49, 357/23.6, 23.8

[56] References Cited

U.S. PATENT DOCUMENTS 4,855,804 8/1989 Borgami et al. ............. 357/49
4,900,693 2/1990 Manning .................. 357/53

FOREIGN PATENT DOCUMENTS 59-74666 4/1984 Japan .................. 357/23.5

OTHER PUBLICATIONS

M. Van Buskirk et al., "E-PROMs Graduate to 256-K Density With Scaled n-channel Process", Intel Corporation Technical article Electronics, published Feb. 24, 1983.

Primary Examiner—Eugene R. LaRoche
Assistant Examiner—R. Ratliff
Attorney, Agent, or Firm—Lowe, Price, LeBlanc & Becker

[57] ABSTRACT

A non-volatile semiconductor memory device includes a substrate (1) having a plurality of element-forming regions (3), a plurality of recesses (32) located between the element-forming regions (3), and a plurality of element-isolating regions (31); word lines (8a to 8d); bit lines (10) orthogonal to this word lines; and memory cells (511) each formed at the point of intersection of these word and bit lines at each element-forming region (3). Each memory cell (511) includes an electrically floating electrode (5) in the form of a flat plate, a control gate electrode (7) in the form of a substantially flat plate formed on the floating gate electrode (5) and connected to the word lines (8a to 8d), and a pair of impurity regions (21, 23) formed respectively at opposite sides of the floating gate electrode (5) on the surface of a semiconductor substrate (1). An element-isolating region (31) includes an element-isolating electrode layer (30) formed on the surface of the semiconductor substrate (1) and in the recesses (32).

12 Claims, 5 Drawing Sheets

ELECTRONIC INTEGRATED CIRCUIT HAVING AN ELECTRODE LAYER FOR ELEMENT ISOLATION

BACKGROUND OF THE INVENTION

1. Field of the Invention

This invention relates to an electronic integrated circuit and, more particularly, to an electronic integrated circuit in which element forming regions are isolated from one another using electrode layers for element isolation.

2. Description of the Background Art

An erasable programmable read only memory or EPROM is a non-volatile memory in which the information can be written electrically and the written information can be erased by irradiating the element with ultraviolet rays, whereby the information can be rewritten any number of times.

FIG. 1 is a sectional view of the EPROM forming the background of the present invention. Referring to FIG. 1, the EPROM forming the background of the present invention will be explained.

On the surface of a semiconductor substrate 1, field oxide films 2 for element isolation are formed at a predetermined interval from each other. A thin insulating film 4 is formed on the field oxide film 2 and an element forming region 3 formed between the adjacent field oxide films 2 in which a semiconductor element is to be formed. On the insulating film 4, there is formed a floating gate 5 which is flat at a central portion and raised at the ends in the form of a wing. The central portion of the floating gate is positioned on the element forming region 3 and the wing portion is positioned on portion of the field oxide films 2. Another insulating film 6 is formed on the floating gate 5. Thus the floating gate is sandwiched between the insulating films 4 and 6. The floating gates 5 are separated from other electrical circuitry so that they are, as it were, floating electrically. A control gate 7 is formed on the insulating film 6. This control gate 7 is a portion of a word line 8. A smooth coat film 9 formed of an insulating material is formed on the word line 8, and bit lines 10, lying orthogonally to the word line 8, are formed on the film 9. A glass coat film 11 for protecting the bit lines 10 is formed on the bit lines 10.

FIG. 2 is an enlarged view of a step portion II of the word line shown in FIG. 1. As shown in FIG. 2, the word line 8 consists of a first electrically conducting layer 81 and a second electrically conducting layer 82. As the material for the first electrically conducting layer, polysilicon, for example, is employed. As the material for the second electrically conducting layer, a silicide of high melting point metals, such as tungsten silicide or molybdenum silicide, is employed. The reason of using these silicides is to lower the electrical resistance of the word line.

In the EPROM shown in FIG. 1, the word line 8 includes an inclined portion, as shown in FIG. 2, because of the presence of the thick field oxide film 2. The above silicides of high melting point metals, formed by the chemical vapor deposition method, can be formed only with difficulties because of the presence of this inclined portion. This poses a problem in that the word line 8 presents a higher electrical resistance at this portion.

On the other hand, while it is necessary to reduce the length of the field oxide film 2 for reducing the size of the device or element, another problem is posed in that, if the length of the field oxide film is reduced, the film thickness is also reduced, so that element isolation cannot be achieved satisfactorily.

SUMMARY OF THE INVENTION

It is an object of the present invention to provide an electronic integrated circuit having a relatively flat isolation structure.

It is another object of the present invention to provide a non-volatile semiconductor memory device in which the electrical resistance cf the word line can be lowered.

It is still another object cf the present invention to provide a non-volatile semiconductor memory device in which the size of the overall device can be reduced, and integration density can be increased.

The electronic integrated circuit according to the present invention comprises a plurality of electronic circuit elements integrated on a substrate in a plurality of element forming regions, and an isolation structure for electrically isolating respective ones of the element forming regions. The isolation structure is comprised of a recess formed in the substrate in portion of area between the element forming regions, isolation means formed in the recess and on the surface of the substrate, and a field shield electrode formed on the surface of the substrate and in the recess. As a result, a relatively flat isolation structure is provided.

The non-volatile semiconductor memory device according to the present invention includes word lines, bit lines lying at right angles with the word lines and memory cells formed in the element forming regions at the intersections of these word and bit lines. Each memory cell includes an electrically floating first gate electrode, a second gate electrode formed on the first gate electrode and connected to the word line, and a pair of impurity regions formed respectively at opposite sides of first gate electrode on the surface of the semiconductor substrate. Each element isolation region includes an element-isolating electrode layer formed on the substrate surface.

The non-volatile semiconductor memory device of the present invention makes use of a so-called field shield isolation structure as the isolation structure isolating the memory cells. This structure is comprised of an insulating film formed over the element isolation region on the semiconductor substrate and an element-isolating electrode layer formed on the insulating film. By being provided with a ground potential, this element-separating electrode layer forms a transistor which is in the off state at all times and the channel of which is not formed on the element-isolating region on the semiconductor substrate surface. In this manner, the semiconductor devices on both side of the isolating regions are insulated from each other. With the use of this element isolating structure, the size of the element-isolating region can be reduced as compared with the insulating and isolating method employing a thick oxide film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
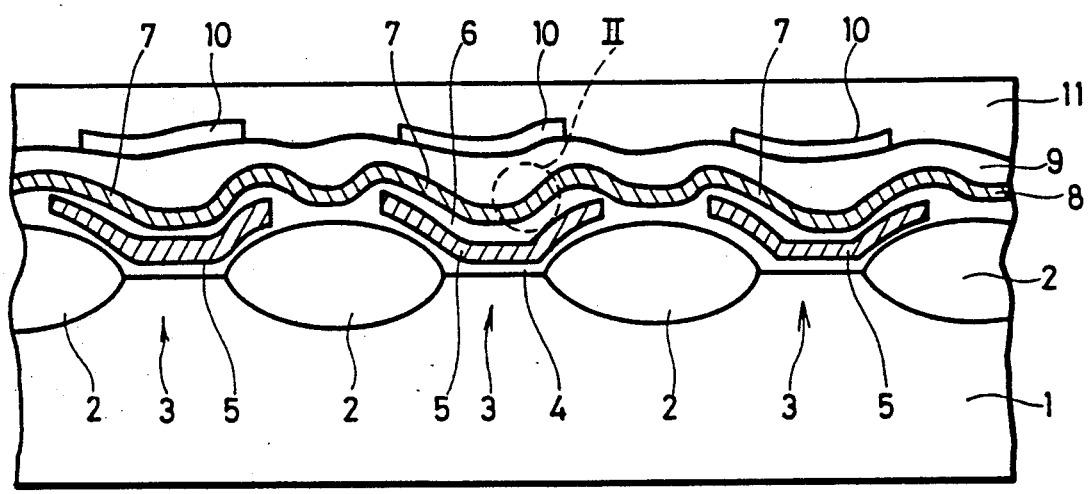
FIG. 1 is a sectional view of an EPROM forming the background of the present invention.
Figure 2:
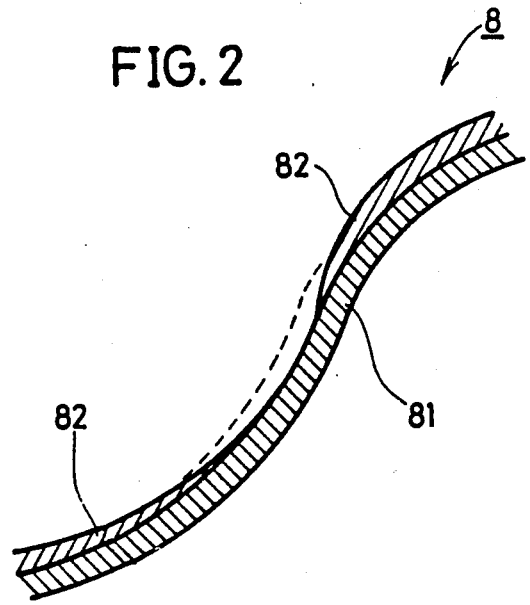
FIG. 2 is an enlarged view of a stepped portion of the word line shown in FIG. 1.

By referring to the drawings, a preferred embodiment of the present invention will be explained in detail.

Figure 3:
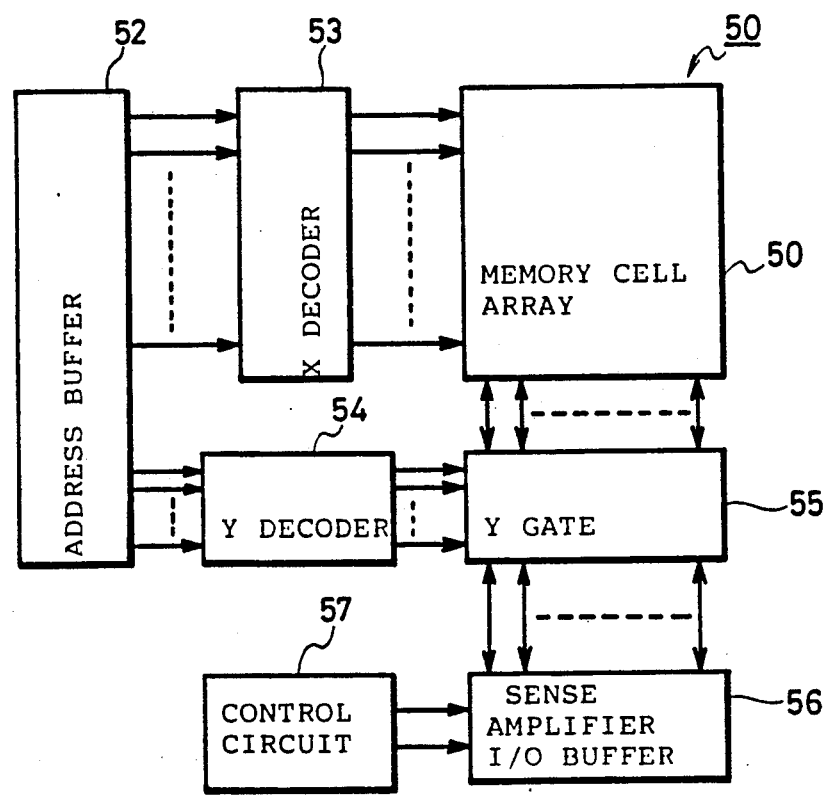
FIG. 3 is a block diagram showing the arrangement of an EPROM to which an embodiment of the present invention is applied.

In FIG. 3, the EPROM 50 includes an array of memory cells 51 having a plurality of memory cells for storing the information in a matrix array, an address buffer 52 for receiving from outside address signals for selecting the memory cell, an X decoder 53, a Y decoder 54 and a Y gate 55 for designating a memory cell by decoding the address signal, a sense amplifier-I/0 buffer 56 for sensing and amplifying the output from the memory cell and transmitting the output to outside in the form of a signal having logical signal levels, and a control circuit 57 for controlling the operation of the overall system.

Figure 4:
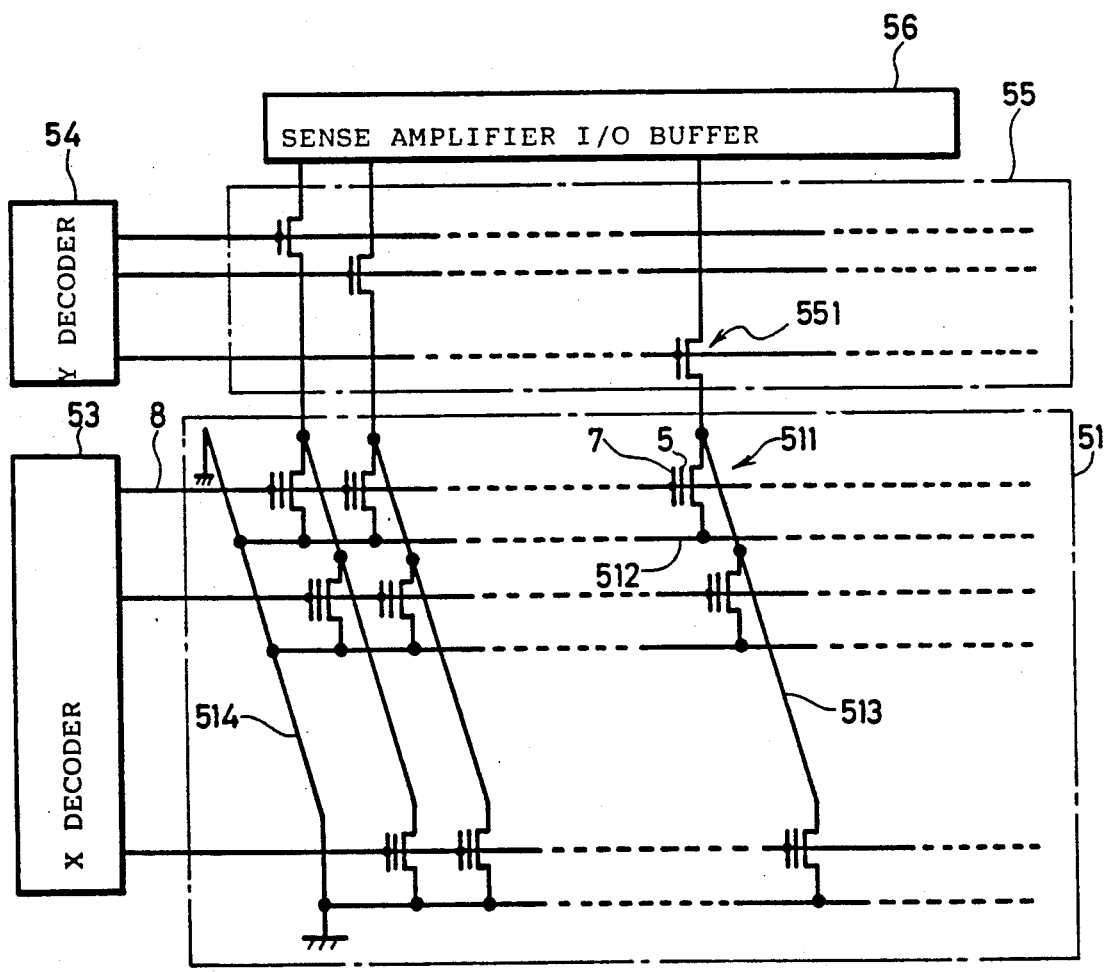
FIG. 4 is an equivalent circuit diagram of an array of memory cells and a peripheral portion thereof shown in FIG. 3.

As shown in FIG. 4, the Y gate 55 includes a plurality of transistors 551 switched responsive to the output of the Y decoder 54. Each memory cell in the array of memory cells 51 is formed by a transistor 511. The transistor 511 has its source connected to a source diffusion line 512 formed by a diffusion layer, while having its drain connected to a drain line 513 (bit line). The source diffusion line 512 is connected to a source metal line 514 formed of a metal such as an aluminum and grounded. Each one source metal line 514 is provided for eight or sixteen drain lines 513. The transistor 511 has its gate formed by a floating gate 5 and a control gate 7. The control gate is connected to the word line 8, while the floating gate is in the state of floating electrically.

Figure 5:
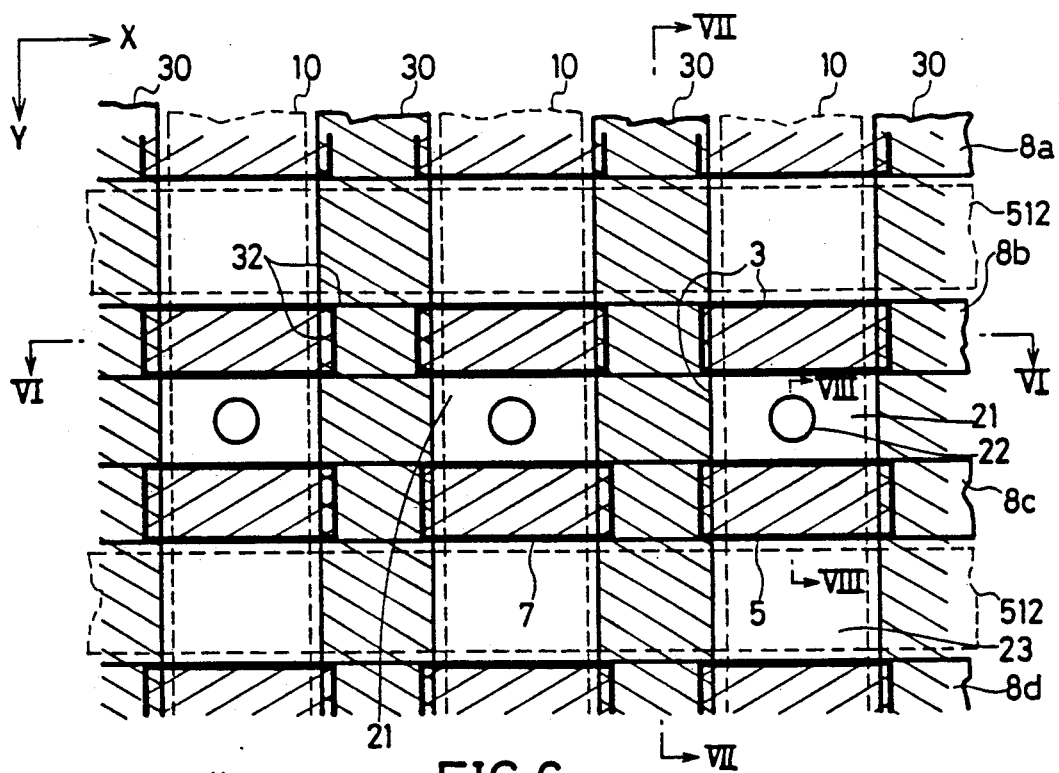
FIG. 5 is a plan view showing a portion of an array of memory cells of an EPROM according to an embodiment of the present invention.
Figure 6:
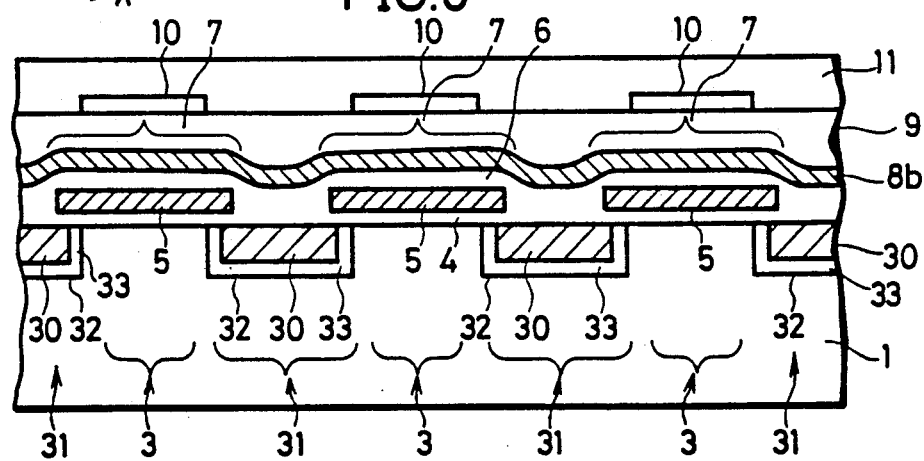
FIG. 6 is a sectional view taken along section line VI—VI in FIG. 5.
Figure 7:
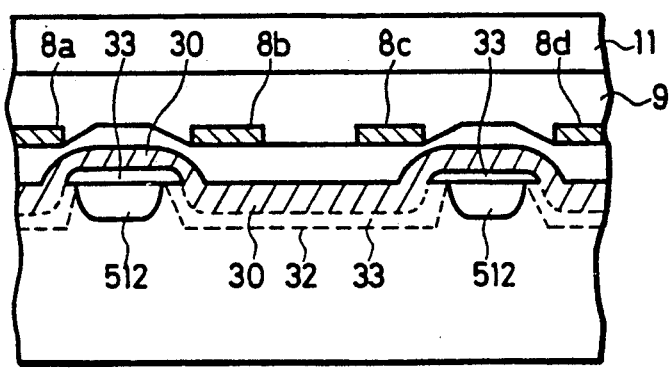
FIG. 7 is a sectional view taken along section line VII—VII shown in FIG. 5.

Referring to FIGS. 5 to 7, the arrangement of the array of memory cells according to an embodiment of the present invention may be explained.

In the array of memory cells, there are provided word lines 8a, 8b 8c and 8d extending in the direction of a letter X and bit lines 10 extending in the direction shown by a letter Y, which is orthogonal to the X direction, as shown in FIG. 5. Each memory cell includes a control gate 7 connected to the word line, a floating gate 5 positioned below the control gate 7 and covered by insulating films 4 and 6, a drain 21 and a source 23, shown in FIG. 8 which are formed respectively at opposite sides of the floating gate 5 on the surface of a semiconductor substrate 1. The drain 21 is connected electrically to the bit line 10 at a contact hole 22. The source 23 of each memory cell is a portion of the region of the source diffusion line 512 extending in the X direction.

On the surface of the semiconductor substrate, there are formed a plurality of element-isolating regions 31 for insulating and separating each element forming region 3. A recess 32 is formed in the element-isolating region 31 of the semiconductor substrate 1, as shown in FIG. 6. As shown in FIG. 7, this recess 32 is formed in a region between a source diffusion line 512 and a source diffusion line 512 adjacent thereto. The element-isolating electrode layer 30 is formed on a thin oxide film 33 formed for insulation on the recess 32 and the source diffusion line 512. The element-isolating electrode layer 30 is formed by, for example, polysilicon. Since a plurality of the source diffusion lines 512 and a plurality of the recesses 32 are formed alternately along the Y direction, the cross-sectional area along the longitudinal direction of the element-isolating electrode layer 30 represents a repetition of alternately elevated and recessed portions.

The element-isolating electrode layer 30 is embedded in the semiconductor substrate 1 in the region where the floating gate 5 is to be formed, so that, as shown in FIG. 6, the floating gate 5 can be formed as a flat plate. Thus, the level difference of the stepped portions of the word line formed on the floating gate 5 is markedly reduced as compared with that of the prior-art example shown in FIG. 1, so that, when the word line is formed by a polysilicon layer and a layer of high melting point metal silicide, the layer of the high melting point metal silicide may be formed with uniform thickness on the polysilicon layer. In this manner, the low electrical resistance of the word line can be realized.

Figure 8:
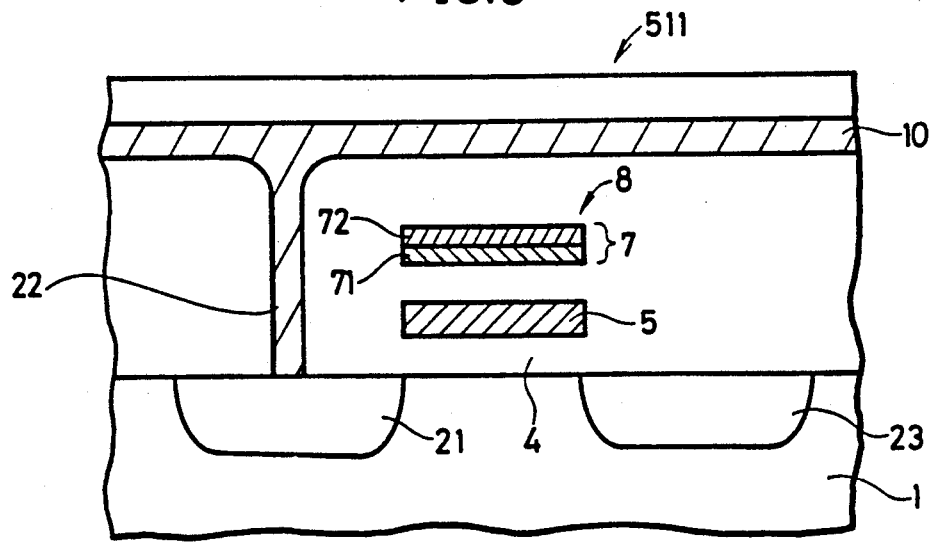
FIG. 8 is an enlarged sectional view taken along section line VIII—VIII shown in FIG. 5.

In FIG. 8, the control gate 7 is formed by a polysilicon layer 71 and a tungsten silicide layer 72. Referring to FIG. 8, the operation of the EPROM is hereinafter explained.

For writing the information in the memory cell, a high electrical voltage of 10 to 20 V is applied to the control gate 7 and the drain 21 to allow the current to flow between the source 23 and the drain 21 in the cell. A portion of the electrons flowing in the cell are accelerated by the high electrical field in the vicinity of the drain 21 to acquire the energy to pass through an energy barrier of the gate insulating film 4, so as to be introduced into the floating gate 5. Since the floating gate 5 is not connected electrically with other circuit portions, electrical charges can be stored semipermanently therein.

For reading out of the information, a cell is selected by the word line 8 connected to control gate region 7 above floating electrode 5 and the bit line 10. The threshold value of the transistor 511 is changed by the charges stored in the floating gate 5, so that the electrical current flowing in the selected cell is changed by the information. This current can be detected and amplified to read out the information to outside.

For erasing or removing the information, the cell is irradiated with ultraviolet rays. The electrons stored in the floating gate 5 acquire the energy by the ultraviolet rays to pass through the energy barrier of the oxide film so as to be emitted into the semiconductor substrate 1 or the control gate 7.

The element-isolating operation employing the element-isolating electrode layer 30 is hereinafter explained. In this method, a potential of 0 V is applied to the element-isolating electrode layer 30. That is, the transistor having the element-isolating electrode layer 30 as the gate is turned off. This allows the memory cells to be isolated from one another.

Figure 9A:
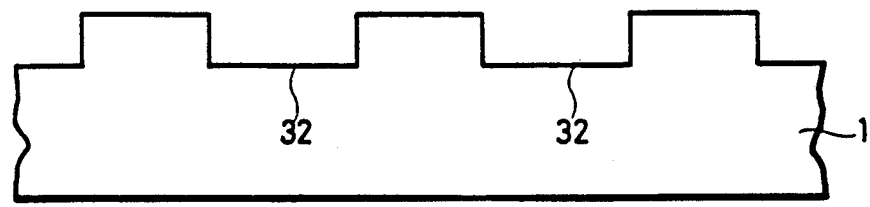
FIGS. 9A to 9D are sectional views for illustrating a process for producing a memory cell according to an embodiment of the present invention.

The method of producing the memory cell of the present embodiment is explained by referring to FIGS. 9A to 9D, which correspond to section line VI—VI of FIG. 5. Referring first to FIG. 9A, a plurality of recesses 32 each having a predetermined rectangular shape are formed in a matrix configuration on the surface of the semiconductor substrate 1. Then, impurity ions are implanted into the region where a source diffusion line is to be formed, which region is now illustrated in the section.

Figure 9B:
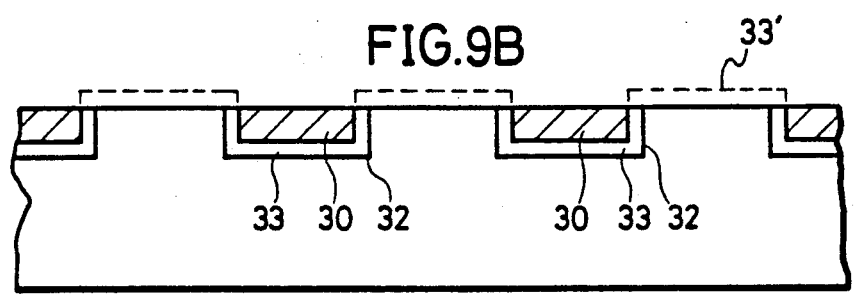

Then, referring to FIG. 9B, a thin oxide film 33 is formed on the overall surface, portions 33' thereof, above the substrate surface being removed. On this oxide film, a polysilicon film is formed and subjected to a patterning operation. In this manner, the oxide film 33 and the element-isolating electrode layer 30 extending in the Y direction shown in FIG. 5 are formed. The reason why the formation of the element-isolating electrode layer is preceded by the ion implantation is to prevent the source diffusion line 512 from being disrupted as a result of the formation of the element-isolating electrode layer 30.

Figure 9C:
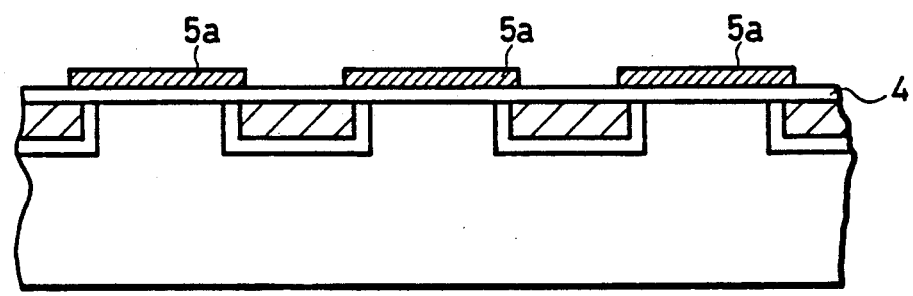

Referring to FIG. 9C, the thin insulating film 4 is formed, and a polysilicon film, which will form the floating gate 5a, is formed on this insulating film 4. This polysilicon film is etched in the form of bands to form floating gate lines 5a extending in the Y direction shown in FIG. 5.

Figure 9D:
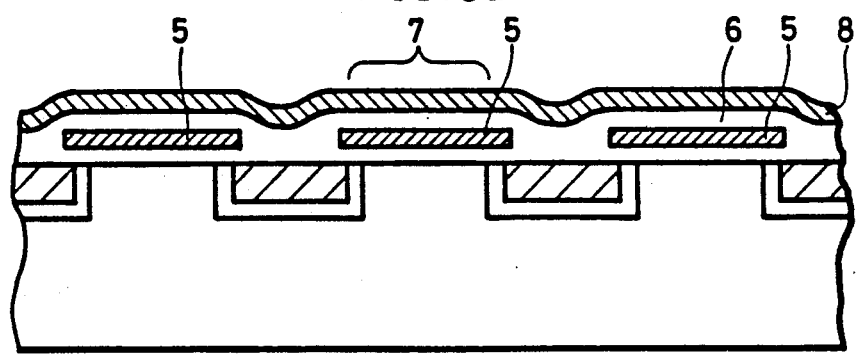

Then, referring to FIG. 9D, the insulating film 6 is film and the polysilicon film which will form the control gate 7 are formed on this insulating film 6. This polysilicon and tungsten silicide films are etched in the form of bands to form word lines 8 extending in the X direction shown in FIG. 5. At this time, the floating gate lines 5a below the control gates 7 are also etched, so that the floating gate lines 5a is divided into the floating gates 5. Then, impurity ions are injected with the element-isolating electrode layer 30 and the word line 8 as the mask to form the source and the drain. Then, the smooth coat film 9 is formed on the word line 8. Then, contact hole 22 connecting to the drain 21 is formed, and an aluminum film is formed on the overall surface and patterned to form bit lines 10. Then, the protective film 11 is formed. This completes the array of memory cells shown in FIGS. 5 to 7.

It will be noted that, although the polysilicon film and the tungsten silicide films are used in the above embodiment as the word line, tungsten silicide may be replaced by silicides of other high melting point metals, such as molybdenum silicide. Any other electrically conductive materials may be used, as long as it is of low electrical resistance.

It will be appreciated that, according to the present invention, the element-isolating region is formed by the insulating film formed on the semiconductor substrate and the element-isolating electrode layer formed on this insulating film, so that the size of the element-isolating region may be reduced. In this manner, the word lines formed on the element-isolating regions present lesser undulations and the word lines may be formed easily as the electrically conductive layers of lower electrical resistance. On the other hand, the degree of integration of the memory cells may be improved by reducing the size of the element-isolating regions Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electronic integrated circuit having a plurality of electronic circuit elements integrated on a substrate in a plurality of element forming regions, and an isolation structure for electrically isolating respective ones of said element forming regions, said isolation structure and said element forming regions having adjacent upper surfaces facilitating formation of a low resistance interconnection layer thereover by avoiding surface irregularities in said upper surfaces, said integrated circuit comprising recesses formed in said substrate in portions of areas between said element forming regions;

insulation means formed in said recesses and on the surface of said substrate;

a field shield electrode formed on the surface of said substrate and in said recesses that provides an isolation field when an activation voltage is applied thereto, an upper surface of said field shield electrode being substantially planar with upper surfaces of adjacent ones of said element forming regions whereby a relatively flat isolation structure is provided; and an interconnection layer formed over said field shield electrode and said adjacent element forming regions.

2. A non-volatile semiconductor memory device having embedded regions separating adjacent element-forming regions forming adjacent upper surfaces facilitating formation of low resistance word lines thereover by avoiding surface irregularities in said upper surfaces, said memory device comprising:

a semiconductor substrate having a plurality of element-forming regions in each of which a semiconductor element is to be formed, a plurality of recesses located between said element-forming regions, and a plurality of element-isolating regions each adapted for isolating ones of said element forming regions;

a plurality of word lines;

a plurality of bit lines crossing at any angle with said word lines; and a plurality of memory cells each formed in said element forming region at the point of intersection between said word lines and said bit lines, each memory cell including an electrically floating first gate electrode formed on the surface of an insulator formed on said semiconductor substrate, a second gate electrode formed on said first gate electrode and connected to said word lines, and a pair of impurity regions formed respectively at opposite sides of said first gate electrode on the surface of said semiconductor substrate, said element-isolating region under a portion of one of said word lines and including a field shield electrode that provides an isolation field when an activation voltage is applied thereto formed on said insulator on the surface of said semiconductor substrate and in said recesses, upper surface of said field shield electrodes being substantially planar with upper surfaces of adjacent portions of said substrate.

3. The non-volatile semiconductor memory device according to claim 2, wherein
said second gate electrode includes a first electrically conductive layer and a second electrically conducting layer formed on said first electrically conducting layer.

4. The non-volatile semiconductor memory device according to claim 3, wherein
said first electrically conducting layer is a polycrystal silicon layer, and said second electrically conducting layer is a layer of a high melting point metal silicide.

5. A non-volatile semiconductor memory device having embedded regions separating adjacent element-forming regions having adjacent upper surface facilitating formation of low resistance word lines thereover by avoiding surface irregularities in said upper surfaces, said memory device comprising:
a semiconductor substrate having a plurality of said element-forming regions in each of which a semiconductor element is to be formed, and a plurality of element-isolating regions containing isolation structure, at least a linear region of which lies below an upper surface of said substrate, and each adapted for isolating element-forming regions, a field shield electrode that provides an isolation field when an activation voltage is applied thereto embedded in said element-isolating region on said semiconductor substrate, an upper surface of said field shield electrode being substantially planar with upper surfaces of adjacent ones of said element forming regions;
word lines formed over said element-isolation regions and including a first electrically conductive layer and a second electrically conductive layer having an electrical resistance lower than that of said first electrically conductive layer;
bit lines laying at an angle with said word lines; and
a plurality of memory cells each formed in said element-forming region at the point of intersection between said word lines and said bit lines,
each memory cell including
an electrically floating first gate electrode formed in he form of a flat plate on the surface of said semiconductor substrate,
a second gate electrode formed on said first gate electrode and connected to said word lines, and
a pair of impurity regions formed respectively at opposite sides of said first gate electrode on the surface of said semiconductor substrate.

6. An electronic integrated circuit according to claim 1, wherein
said interconnection layer includes a first electrically conductive layer and a second electrically conductive layer formed on said first electrically conductive layer.

7. An electronic integrated circuit according to claim 6, wherein
said first electrically conducting layer is a polycrystal silicon layer and said second conducting layer is a metal silicide layer.

8. A non-volatile semiconductor memory device according to claim 5, wherein
said word lines each include a first electrically conductive layer and a second electrically conductive layer formed on said first electrically conductive layer.

9. A non-volatile semiconductor memory device according to claim 8, wherein
said first electrically conducting layer is a polycrystal silicon layer and said second conducting layer is a metal silicide layer.

10. A non-volatile semiconductor memory device as recited in claim 2, wherein said impurity regions extend continuously along said substrate in a direction parallel to said word lines and said element-isolating regions extend along said substrate in a direction parallel to said bit lines, said element-isolating regions formed above said impurity regions on the upper surface of said substrate.

11. A semiconductor memory device comprising:
a semiconductor substrate having a plurality of separated impurity regions formed at a surface thereof and extending continuously in parallel along said substrate;
a plurality of separated parallel conducting layers extending along said substrate in a direction perpendicular to said impurity regions, said conducting layers each having a portion embedded in said substrate in regions between said impurity regions and having upper surfaces substantially planar with the surface of said substrate, said conducting layers each having another portion formed above the surface of said substrate at said impurity regions; and
memory cells formed in regions surrounded by said impurity regions and said conductive layers.

12. A semiconductor memory device as recited in claim 11, wherein said conductive layers and said impurity regions are held at a reference voltage potential to provide isolation for said memory cells.

* * * * *